US008860414B2

(12) United States Patent
Brereton et al.

(10) Patent No.: US 8,860,414 B2
(45) Date of Patent: Oct. 14, 2014

(54) GRADIENT COIL ARRANGEMENT

(75) Inventors: Ian Malcolm Brereton, Queensland (AU); Graham John Galloway, Sinnamon Park (AU); Viktor Vegh, Holland Park (AU); Quang Minh Tieng, Sinnamon Park (AU)

(73) Assignee: The University of Queensland, Queensland (AU)

( * ) Notice: Subject to any disclaimer, the term of this patent is extended or adjusted under 35 U.S.C. 154(b) by 441 days.

(21) Appl. No.: 13/141,268

(22) PCT Filed: Dec. 21, 2009

(86) PCT No.: PCT/AU2009/001666
§ 371 (c)(1),
(2), (4) Date: Sep. 6, 2011

(87) PCT Pub. No.: WO2010/071921
PCT Pub. Date: Jul. 1, 2010

(65) Prior Publication Data
US 2012/0032679 A1 Feb. 9, 2012

(30) Foreign Application Priority Data

Dec. 22, 2008 (AU) ................................ 2008906579

(51) Int. Cl.
*G01V 3/00* (2006.01)
(52) U.S. Cl.
USPC ........................................ 324/318; 324/319
(58) Field of Classification Search
CPC .................................................... G01R 33/385
USPC .................. 324/318, 319, 320, 322
See application file for complete search history.

(56) References Cited

U.S. PATENT DOCUMENTS

| 5,343,148 | A | * | 8/1994 | Westphal et al. ............. 324/309 |
| 5,378,989 | A | | 1/1995 | Barber et al. |
| 5,561,371 | A | * | 10/1996 | Schenck ....................... 324/318 |
| 6,078,177 | A | * | 6/2000 | Petropoulos et al. ......... 324/318 |
| 7,417,432 | B2 | * | 8/2008 | Overweg ...................... 324/318 |
| 2006/0033496 | A1 | | 2/2006 | Shvartsman et al. |

FOREIGN PATENT DOCUMENTS

| JP | 63-272335 | 11/1988 |
| JP | 2002085371 | 3/2002 |
| WO | WO 97/35214 | 9/1997 |
| WO | WO 2005/088330 A1 | 9/2005 |
| WO | WO 2005/124381 | 12/2005 |

OTHER PUBLICATIONS

International Preliminary Report on Patentability (IPRP) (Chapter I) for PCT/AU2009/001666, mailed Jan. 22, 2010.

(Continued)

*Primary Examiner* — Louis Arana
(74) *Attorney, Agent, or Firm* — Nixon & Vanderhye P.C.

(57) ABSTRACT

A gradient coil arrangement for use in a magnetic imaging system, the imaging system being for generating a magnetic imaging field in an imaging region provided in a bore. The coil arrangement includes a first portion having a substantially cylindrical shape for positioning in the bore, a second portion extending outwardly from an end of the first portion, the second portion being for positioning outside the bore and at least one coil for generating a gradient magnetic field in the imaging region, the at least one coil having a first part provided on the first portion and a second part provided on the second portion.

23 Claims, 13 Drawing Sheets

(56) References Cited

OTHER PUBLICATIONS

Turner, R. et al., "Gradient Coil Design: A review of Methods", Magnetic Resonance Imaging, vol. 11, (1993), pp. 903-920.
International Search Report for PCT/AU2009/001666, mailed Jan. 22, 2010.
European Patent Office Action dated May 31, 2012, from European Patent Application No. EP 09 83 3921.1.
Vegh, V., et al, "A Wrapped Edge Transverse Gradient Coil Design for Increased Gradient Homogeneity," *Concepts in Magnetic Resonance, Part B*, (*Magnetic Resonance Engineering*), vol. 35B, No. 3, Aug. 2009, pp. 139-152, XP-002675914.

\* cited by examiner

GRADIENT COIL ARRANGEMENT

This application is the U.S. national phase of International Application No. PCT/AU2009/001666, filed 21 Dec. 2009, which designated the U.S. and claims priority to Australia Application No. 2008906579, filed 22 Dec. 2008, the entire contents of each of which are hereby incorporated by reference.

BACKGROUND OF THE INVENTION

The present invention relates to a gradient coil arrangement for use in an imaging system, such as a magnetic resonance imaging (MRI) system, and a method for determining a gradient coil arrangement.

DESCRIPTION OF THE PRIOR ART

The reference in this specification to any prior publication (or information derived from it), or to any matter which is known, is not, and should not be taken as an acknowledgment or admission or any form of suggestion that the prior publication (or information derived from it) or known matter forms part of the common general knowledge in the field of endeavour to which this specification relates.

In MRI, when a substance such as the human tissue is exposed to a strong and uniform polarizing static magnetic field $B_0$, the spins of abundant water hydrogen protons in the tissue align their individual magnetic moments along the magnetic field $B_0$, in a parallel or anti-parallel energy state. There then exists a net magnetic moment of the spin ensemble that is directed along the polarizing flux (low energy or parallel state) and precesses at the characteristic Larmor frequency.

If a spatially homogeneous RF field, $B_1$, oscillating near the Larmor frequency is imposed on the imaged tissue perpendicular to the polarizing field $B_0$, the net longitudinal magnetization, $M_z$, may be 'tipped' or rotated into the plane (x-y) perpendicular to the magnetic field $B_0$ to generate a net transverse magnetization (or the excited state). When the RF field $B_1$ is expired, the net magnetization relaxes back to its original low energy state that existed before the RF field $B_1$ was applied by emitting energy in the form of an RF-signal, or colloquially free induction decay (FID), that may be captured with an RF receive coil and digitally processed to form an MR image.

During the image formation, magnetic field gradients (transverse: $G_x$, $G_y$; and longitudinal: $G_z$) are engaged to frequency encode the spatial origins of the emitted FIDs. A field gradient is generally obtained by circulating strong (time-varying) currents through a dedicated coil wire pattern, also known as the gradient coil.

Standard gradient coils for cylindrical bore magnet arrangements are provided in a cylindrical configuration radially inwardly of the primary magnets, which generate the imaging field. In general, the gradient coils include three separate, actively shielded gradient windings for generating the transverse and longitudinal fields. These constitute to a total of six individual layers, three of which are the so-called primary windings (positive electric current) and three are the shield windings (negative electric current). The space between the primary and shield windings allows for a sufficient gradient field to be created inside the imaging region, and also houses the cooling system.

Many techniques have been developed to identify methods of designing gradient coils, as described for example in Turner, R., *Gradient Coil Design: A Review of Methods.* Magnetic Resonance Imaging, 1993. 11: p. 903-920.

However, the use of a cylindrical structure imposes a limit on the ability to design significantly shorter gradient coils, which in turn places physical size restrictions on the apparatus.

U.S. Pat. No. 5,378,989 describes a magnetic field gradient apparatus for use in a magnetic resonance (MR) imaging system employing open magnets allows access to a patient while the patient is being imaged. The magnetic field gradient apparatus employs two gradient coil assemblies and a gradient coil amplifier. Each gradient coil assembly has a gradient coil carrier with at least one gradient coil disposed on it. Each gradient coil carrier is comprised of a cylinder with a flange at one end. The gradient coil assemblies are positioned in the bore of each ring of the open magnet and spaced apart from each other allowing access to the patient. The gradient coil amplifier provides timely current through the gradient coils to create a magnetic field gradient which has high linearity inside an imaging volume. However, in order to reduce the rise time of the gradient coil this requires an increase in the applied, which results in an increase power consumption, which is in turn undesirable. A coil is disposed on cylinders which surround each gradient coil assembly and fit inside the bore of each ring which acts as an active shield and minimizing eddy currents in conductors outside the gradient coil assemblies.

U.S. Pat. No. 5,638,595 describes a method for fabricating a gradient coil for an MR imaging system having an open magnet. The method includes forming a structure from thin conductive material such as copper, the structure generally comprising a section of a cylinder and a section of an annulus joined to an edge of the cylinder section as a flange. During a first cutting operation, a plurality of first groove segments are cut through the material, each of the first groove segments lying in one of a plurality of cutting zones selectively positioned around the structure, a strip of material positioned between two adjacent groove segments comprising a coil turn segment. The coil turn segments of a cutting zone are rigidly joined to one another and to a support frame comprising the outer edge of the structure by suitable means. Thereafter, a second cutting operation is performed, whereby a plurality of second groove segments are cut through the material to completely form the gradient coil.

However, these gradient coils are for use in open bore configurations, as opposed to the more classical cylindrical bore arrangements. Consequently, the coils are designed to allow a gradient field to be provided adjacent the annular portion of the coil, which is unsuitable for cylindrical bore arrangements.

Other special layout gradient coils with the ability to produce high resolution images have been designed, as described for example in Crozier, S., et al., *An "Openable" High Strength Gradient Set for Orthopedic MRI.* Journal of Magnetic Resonance, 1999. 139: p. 81-89; Dodd, S. J. and C. Ho, *Short Planar Gradient Coils for MR Microscopy Using Concentric Return Paths.* Journal of Magnetic Resonance, 2002. 156: p. 1-9; Leggett, J., D. Green, and R. Bowtell, *Insert Dome Gradient Coils for Brain Imaging.* Proc. Intl. Soc. Mag. Reson. Med., 2006. 14; Tomasi, D., et al., *Asymmetric Gradient Coil for Head Imaging.* Magnetic Resonance in Medicine, 2002. 48: p. 707-714; Williams, G. B., et al., *Design of biplanar gradient coils for magnetic resonance imaging of the human torso and limbs.* Magnetic Resonance Imaging, 1999. 17(5): p. 739-754; Sanchez, H., et al., *Three-Dimensional Gradient Coil Structures for Magnetic Resonance*

*Imaging Designed Using Fuzzy Membership Functions.* Magnetics, IEEE Transactions on, 2007. 43(9 Part 1): p. 3558-3566.

However, again these are specialist layouts for specific uses and are not practical for use in standard cylindrical bore configurations.

Additionally, the configuration of gradient coils can give rise to a number of other issues during the imaging process. This can include the generation of acoustic noise, which is exacerbated by the bore configuration which acts as an acoustic duct.

Another important issue relating to gradient coil design is peripheral nerve stimulation (PNS), which is observed as a crawling, twitching and pulsing sensation under the skin, and which is induced by fast switched gradient coils which promote a time dependent magnetic field behaviour that induces eddy currents in volumes in which closed loop current paths can form, provided that the spatial variation of the magnetic field is large. A number of approaches can be used to reduce PNS, such as limiting the switching speed of the gradient coils, or reducing high order harmonics in the field expansions, which is not easily achieved due to size and shape constraints placed upon the gradient coils. As superconducting magnets become shorter the observed PNS tends to increase, due to the generation of steeper gradients over a smaller value.

SUMMARY OF THE PRESENT INVENTION

The present invention seeks to substantially overcome, or at least ameliorate, one or more disadvantages of existing arrangements.

In a first broad form the present invention provides a gradient coil arrangement for use in a magnetic imaging system, the imaging system being for generating a magnetic imaging field in an imaging region provided in a bore, the coil arrangement including:
- a) a first portion having a substantially cylindrical shape for positioning in the bore;
- b) a second portion extending outwardly from an end of the first portion, the second portion being for positioning outside the bore; and,
- c) at least one coil for generating a gradient magnetic field in the imaging region, the at least one coil having a first part provided on the first portion and a second part provided on the second portion.

Typically the first part is for generating the gradient field.

Typically the second part is for providing a return current path.

Typically the second portion has a substantially annular shape.

Typically the second portion extends radially outwardly from the first portion.

Typically the coil arrangement includes:
- a) at least one primary coil for generating the gradient field; and,
- b) at least one shield coil for generating a shielding field.

Typically the at least one shield coil is provided radially outwardly of the at least one primary coil.

Typically the coil arrangement includes at least first and second primary coils for generating first and second gradient fields.

Typically the coil arrangement is for generating a transverse gradient field.

Typically the transverse gradient field is transverse to a bore axis of the imaging apparatus.

Typically the coil arrangement includes a number of cooling pipes for receiving a coolant second portion has a substantially annular shape.

Typically the gradient coil arrangement includes first and second coil arrangement sections positioned in opposing first and second ends of the bore, each section having respective first and second portions and respective coils.

In a second broad form the present invention provides a method of determining a gradient coil arrangement for use in a magnetic imaging system, the imaging system being for generating a magnetic imaging field in an imaging region provided in a bore, the method including determining a coil arrangement including:
- a) a first portion having a substantially cylindrical shape for positioning in the bore;
- b) a second portion extending outwardly from an end of the first portion, the second portion being for positioning outside the bore; and,
- c) at least one coil for generating a gradient magnetic field in the imaging region, the at least one coil having a first part provided on the first portion and a second part provided on the second portion.

Typically the method includes:
- a) designing at least one gradient coil layout; and,
- b) determining if the gradient coil layout is acceptable by at least one of:
  - i) simulating acoustic noise generated by the coil layout; and,
  - ii) determining high order field oscillations.

Typically the method includes:
- a) determine target field components;
- b) determine current densities required to generate the target field components; and,
- c) determine gradient coil wire paths using the current densities.

Typically the method includes, using a stream function to determine current densities required on at least the first portion to generate the required field components.

Typically the method includes:
- a) selecting a number of wire paths; and,
- b) determine gradient coil wire paths using the selected number.

Typically the method includes, contouring the stream function using the selected number of wire paths to determine discrete wire paths.

Typically the method includes:
- a) determining a theoretical field generated by the wire paths; and,
- b) using the theoretical field to determine if the wire paths are acceptable.

Typically the method includes:
- a) comparing the theoretical field to the target field;
- b) determining if the wire paths are acceptable based on the results of the comparison.

Typically the method includes
- a) determining an error function using the results of the comparison for each of a different number of wire paths; and,
- b) selecting a wire path configuration based on the determined error functions.

Typically the method includes, simulating acoustic noise generated by the coil arrangement by:
- a) determining forces acting on wires in the gradient coils;
- b) determining wire displacements generated by applied currents; and,
- c) determining a pressure wave generated by the wire displacement; and, d) determining the sound pressure level using the generated pressure wave.

Typically the method includes, determining wire displacements by:

a) determining steady state wire displacements; and,
b) determining wire displacement induced by applied current using the steady state wire displacements.

Typically the method includes, determining high order field oscillations at least in part by determining spherical harmonic components generated by the wire arrangement.

BRIEF DESCRIPTION OF THE DRAWINGS

An example of the present invention will now be described with reference to the accompanying drawings, in which:—

DETAILED DESCRIPTION OF THE PREFERRED EMBODIMENTS

Figure 1A:
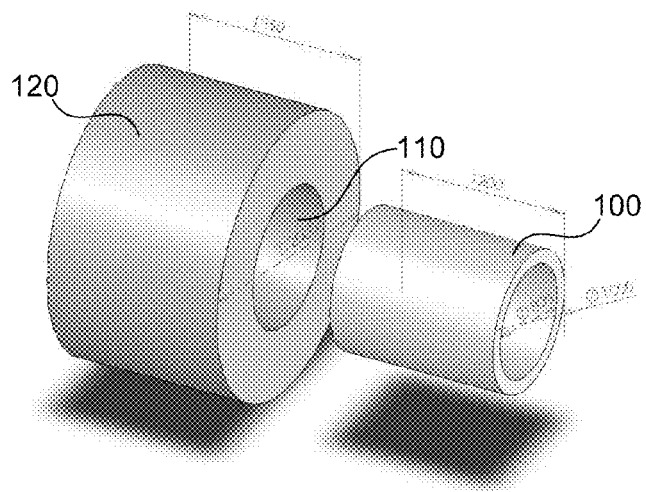
FIG. 1A is a schematic perspective exploded view of a classical MRI magnet-gradient coil assembly.
Figure 1B:
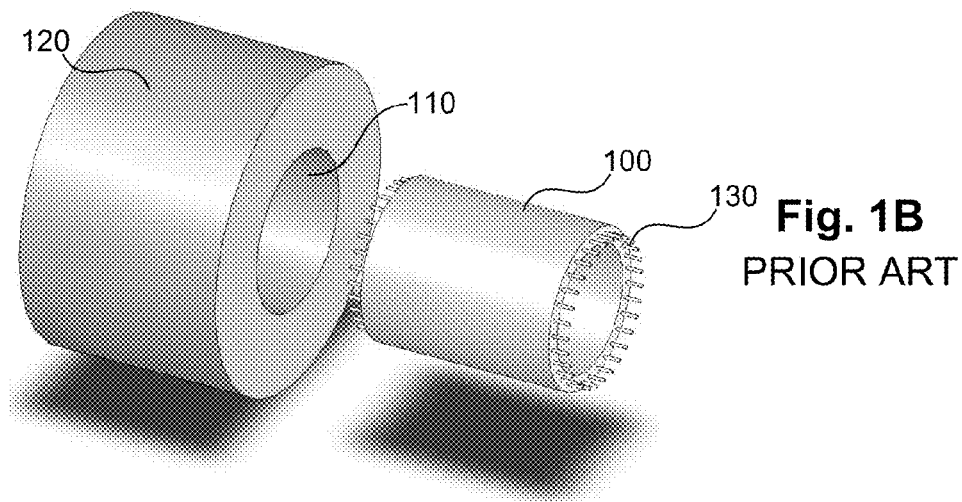
FIG. 1B is a schematic perspective exploded view of the coil assembly of FIG. 1A including cooling pipes.
Figure 1C:
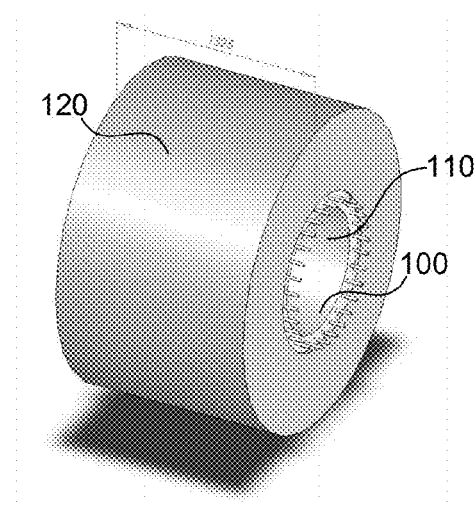
FIG. 1C is a schematic perspective view of the coil assembly of FIG. 1B in an assembled state.

An example of a classical gradient coil assembly is shown in FIGS. 1A to 1C.

In FIG. 1A, the gradient coil assembly 100 has a substantially cylindrical shape and is adapted for insertion into a cylindrical bore 110 of a primary magnet assembly 120. As shown in FIG. 1B the gradient coil assembly may include cooling pipes 130 for circulating coolant, such as water, through the gradient coils, as will be appreciated by persons skilled in the art.

It should be noted that clinical whole body gradient coil assemblies generally consist of three separate, actively shielded gradient windings for generating orthogonal gradient fields. These constitute a total of six individual layers, three of which are the so-called primary windings (positive electric current) and three are the shield windings (negative electric current). A space between the primary and shield windings allows for a sufficient gradient field to be created inside the imaging region, and also houses the cooling pipes 130.

For a geometry in which the bore is aligned along a z-axis, x- and y-gradient coils generate transverse gradient fields, and typically such coils arrangements are the hardest to design. In this regard, the z-gradient coil, which generates what is often referred to as the longitudinal gradient, is comparatively easy to design. This is due to the fact that the z-gradient coil windings consist of circular loops non-linearly spaced apart from one another to achieve gradient field linearity. As a result, all of the wire loops in a z-gradient coil produce a useful field, whereas in the transverse case the return paths of the windings are actually detrimental to the gradient field linearity, and have to be corrected for in the design. This limits the ability of the transverse gradient coils to provide required gradient field linearity and as a result increases the length of the gradient coil configuration required to generate a gradient field of a given linearity.

An example of a modified gradient coil assembly will now be described with references to FIGS. 2A to 2C. In this example, the gradient coil assembly includes first and second sections 200, 210, each of which includes a first portion 201, 211 and a second portion 202, 212. In use, each first portion 201, 211 is adapted to be inserted into a bore 110 of a primary magnet arrangement 120 so that the first portions 201, 211 substantially abut against each other within the bore, so that the entire gradient coil assembly extends along the entire bore length.

In this example, the gradient coils are arranged so that at least a first part of at least one coil is provided on the first portion 201; 211, whilst a second part of the at least one coil is provided on the second portion 202; 212. In use, this arrangement is such that the first part of the at least one coil is used in generating a gradient field, whilst the second part of the at least one coil provides the return current path. As the return current path, and consequently any generated magnetic field, is located outside of the bore 110, the return current path does not contribute substantially to the gradient field thereby resulting in significant improvement in the linearity of the transverse gradient fields. This in turn allows for a reduction in the length of the gradient coil assembly, as will be described in more detail below.

In the above example, the gradient coil assembly is generally manufactured in two sections to allow it to be easily inserted into the bore 110. However, this use of two sections is not essential, and other suitable arrangements that allow return current paths to be provided on the outside of the bore may be used.

Figure 2A:
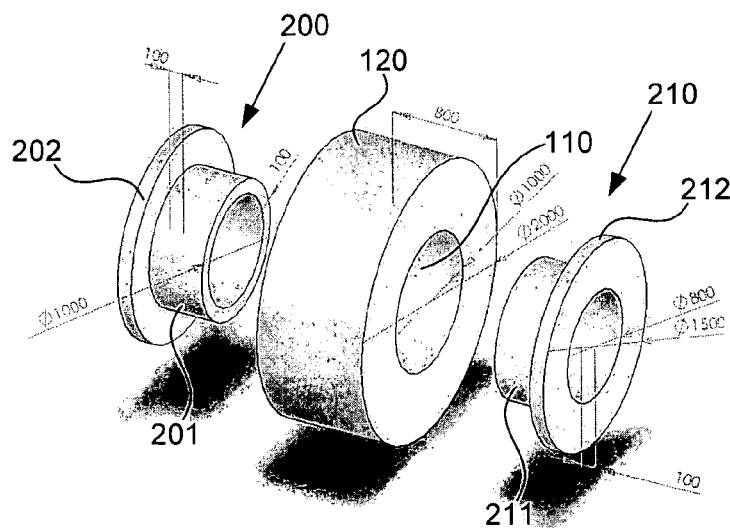
FIG. 2A is a schematic perspective exploded view of an example of a modified magnet-gradient coil assembly.
Figure 2B:
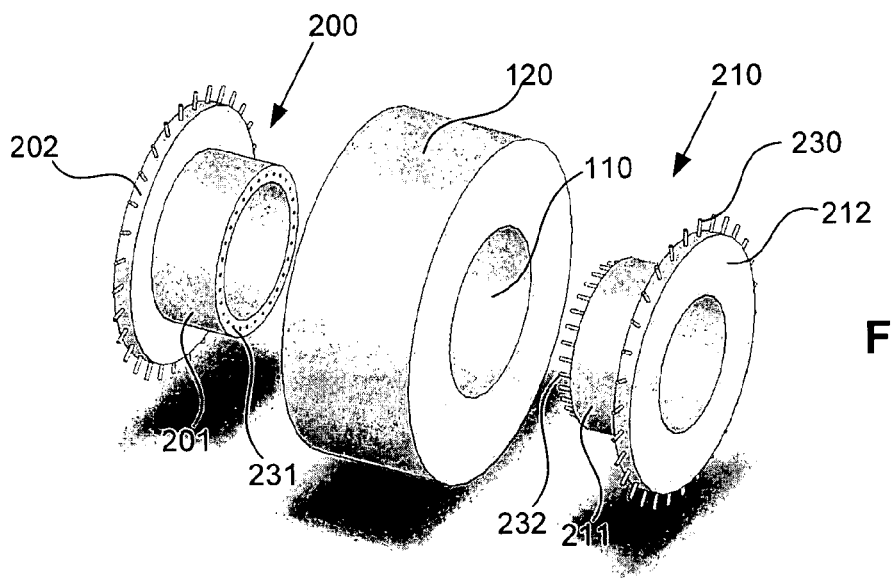
FIG. 2B is a schematic perspective view of the modified magnet-gradient coil assembly of FIG. 2A including cooling pipes.

In the example of FIG. 2B, cooling pipes 230 may also be provided as part of the coil assembly. In one example, each coil assembly section 200, 210 includes cooling pipes which are independent, such that each coil assembly section 200, 210 is cooled independently. In this example, however, the coil assembly section 200 includes ports 231 which receive cooling pipe ends 232 to allow coolant to be circulated through both the gradient coil assembly sections 200, 210 as though these were a single assembly.

Figure 2C:
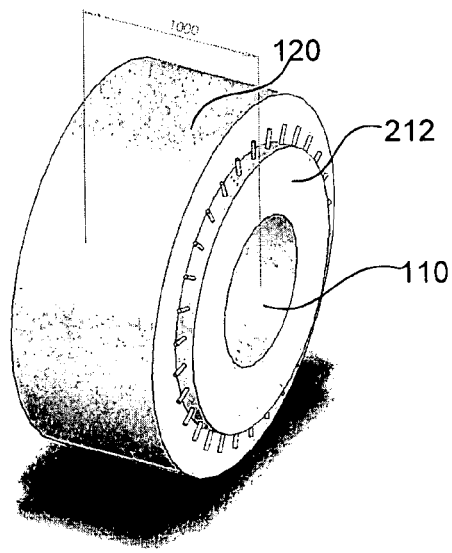
FIG. 2C is a schematic perspective view of the modified magnet-gradient coil assembly of FIG. 2B in an assembled stated.

An example of the assembled imaging apparatus is shown in FIG. 2C.

Figure 3:
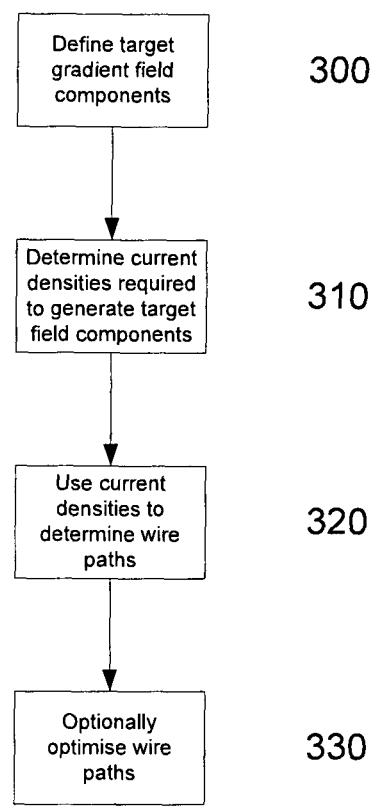
FIG. 3 is a flowchart of an example process for designing a coil arrangement for a modified gradient coil assembly.

An example process for designing a coil layout for use in a coil arrangement will now be described in more detail with reference to FIG. 3. In this example, at step 300 target gradient field components are defined. This may be achieved in any suitable manner, but typically involves examining requirements for the resulting imaging apparatus, taking into account the desired geometry of the imaging apparatus, and in particular the magnetic field gradient required over the imaging region, commonly referred to as the diameter sensitive volume (DSV) and sometimes as the Field-of-View (FOV).

At step 310, current densities required to generate the target field components are calculated. This may be achieved using any suitable technique, such as spherical harmonics or the like, and typically takes into account the desired geometry of the resulting gradient coil assembly, which will in turn depend on the bore and DSV sizes for the resulting imaging apparatus.

At step 320 the current densities are used to determine discrete wire paths representing the coils to be provided. This may be achieved using any suitable technique, such as by contouring a stream function used to define the current densities.

The resulting wire paths may then optionally be optimised at step 330. In one example, this may be achieved using an iteration process, varying parameters such as the geometry of the coil assembly, or the number of coil paths defined during the contour process, allowing a suitable layout to be determined.

Figure 4:
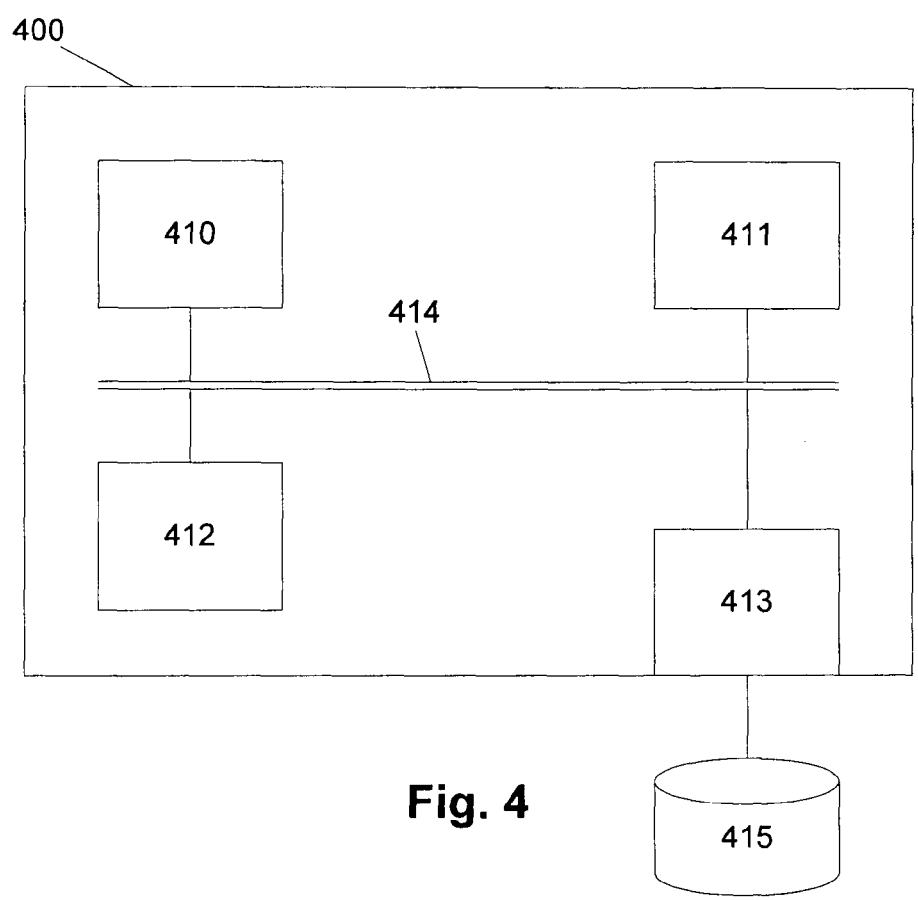
FIG. 4 is a schematic diagram of a computer system.

In one example, the above described process is performed at least in part utilising a processing system, an example of which will now be described with reference to FIG. 4.

In this example the processing system 400 includes a processor 410, a memory 411, an input/output device, such as a keyboard and mouse 412, and an optional external interface 413 coupled together via a bus 414. The optional external interface may be coupled to a database 415, allowing the processing system 400 to store data and/or access previously stored data.

In use, the processor 410 typically executes applications software stored in the memory 411, to allow the processor 410 to perform required calculations and/or display results. This can include, for example, performing analysis of the desired field to determine the current density, calculating the wire paths, and allowing modification of parameters to optimise the resulting arrangement. It will be appreciated that these processes can be performed automatically, but typically involve at least some input or other control by the user.

It will therefore be appreciated that the processing system 400 may be a suitably programmed computer system, such as a laptop, desktop, PDA, computer server, or the like, although alternatively the processing system 400 may be formed from specialised hardware.

In general, gradient coils tend to give rise to a number of issues relating to imaging, which should be considered as design parameters. Acoustic noise produced by gradient coils promotes discomforts for patients, and accordingly, this may be taken into account when designing the gradient coil assembly. Similarly, another important issue relating to gradient coil design is PNS, which is induced by fast switched gradient coils. The magnetic field spatial variations can be measured through decomposition into representative spherical harmonic coefficients, of which high order values indicate non-linear behaviour, allowing designs exhibiting this behaviour to be avoided.

Figure 5:
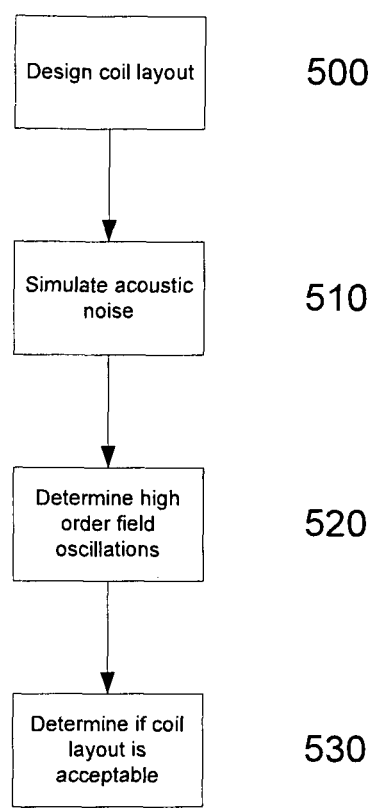
FIG. 5 is a flowchart of an example process for designing a modified gradient coil assembly.

Additional steps performed to take these factors into account will now be described with reference to FIG. 5.

In this example, at step 500 a coil layout is designed as described above with respect to FIG. 3.

At step 510, an acoustic noise simulation may be performed in order to determine the noise levels that will be generated when the resulting assembly is used. This can be used to avoid implementation of coil assemblies that will result in excessive noise, which can cause discomfort to subjects being imaged by the imaging apparatus.

Acoustic simulation may be performed using any suitable technique, but will typically involve calculating forces acting on wires in the gradient coils to thereby determine a wire displacement and resulting pressure waves, which are turn indicative of the sound pressure that will be generated in the bore.

Similarly, at step 520 high order field oscillations may be analysed to check the likelihood of the coil arrangement resulting in the occurrence of PNS or other similar effects. At step 530 it is determined if the coil layout is acceptable and if so, this can then be implemented.

Accordingly, it will be appreciated that the above described process allows gradient coil arrangements similar to those shown in FIGS. 2A to 2C to be generated. This allows a significantly reduced length of gradient coil assembly whilst at least maintaining the linearity of the generated gradient fields. In one example, this can be used to generate a coil assembly having an overall length of 80 cm, that provides gradient fields equivalent to those generated by magnet assemblies of 120 cm using current design techniques, as will be described in more detail below.

Accordingly, the above described process can take into account parameters such as:
Size—The physical dimensions of the coil;
Field homogeneity—The gradient magnetic field linearity over the imaging volume;
Noise—The amount of acoustic noise produced by the coil when switched is limited for safety;
PNS—Peripheral nerve stimulation is important for patient safety;
Claustrophobia—The combination of the inner diameter of the gradient coil and its length promotes patient discomfort; and
Inductance—The gradient coil rise time is a function of coil inductance and therefore should be minimised to a level above the PNS threshold.

Steps can be taken to reduce these factors through appropriate gradient magnetic field definitions and minimisation of Lorentz forces acting on the gradient coils.

Figure 6A:
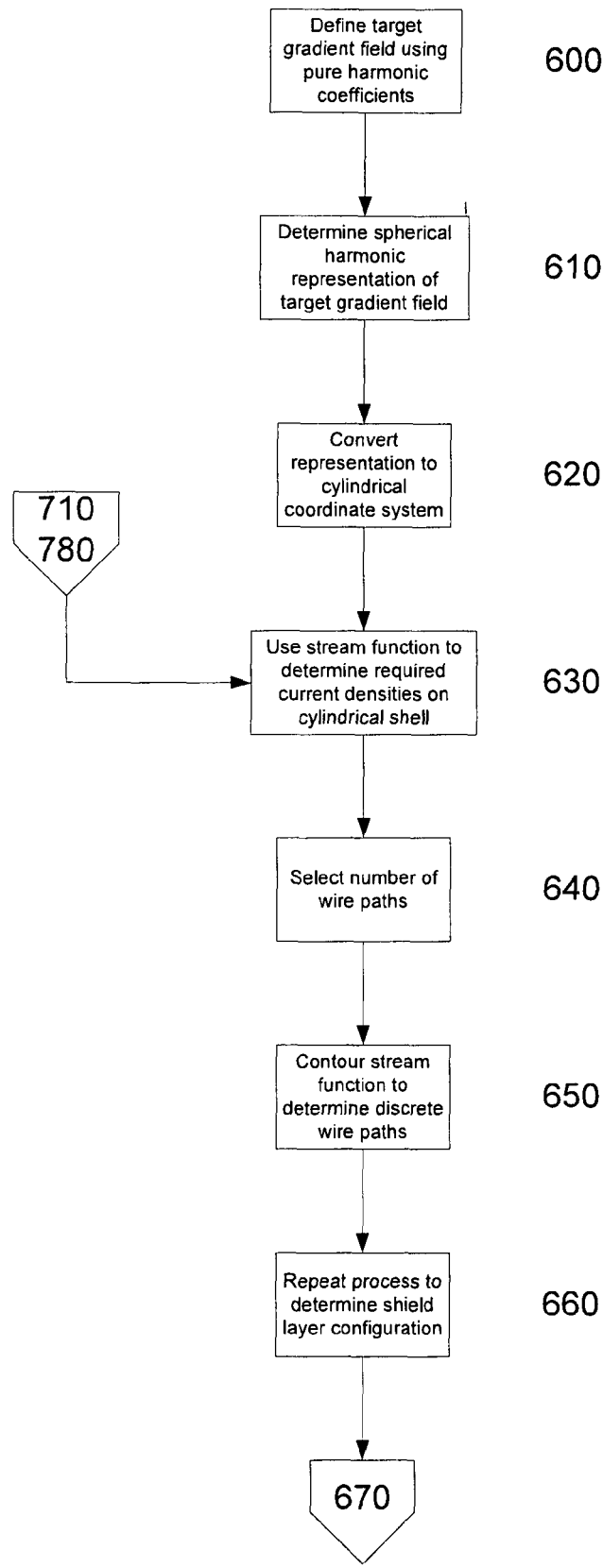
FIGS. 6A to 6C are a flowchart of a second example of a process for designing a modified gradient coil assembly.
Figure 6B:
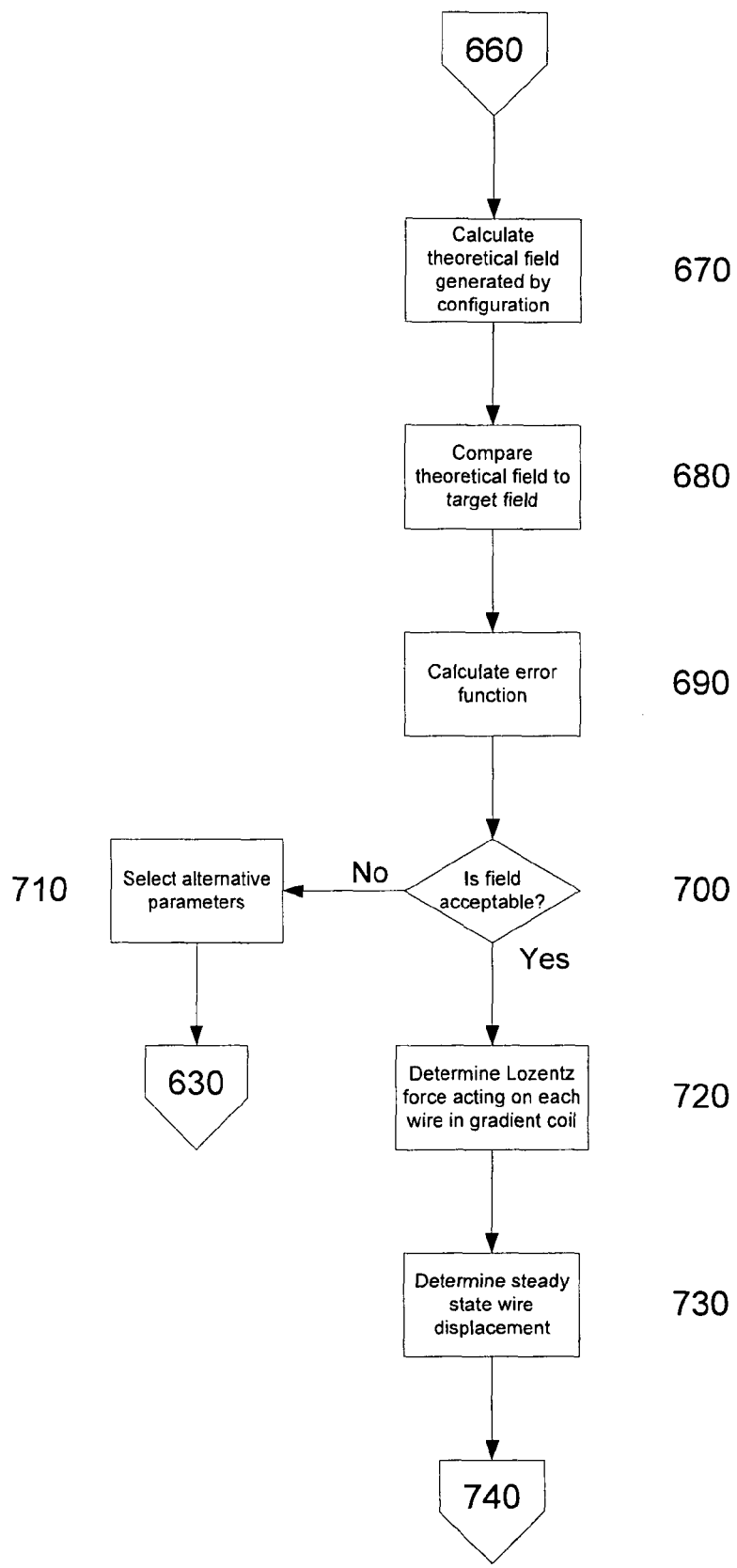
Figure 6C:
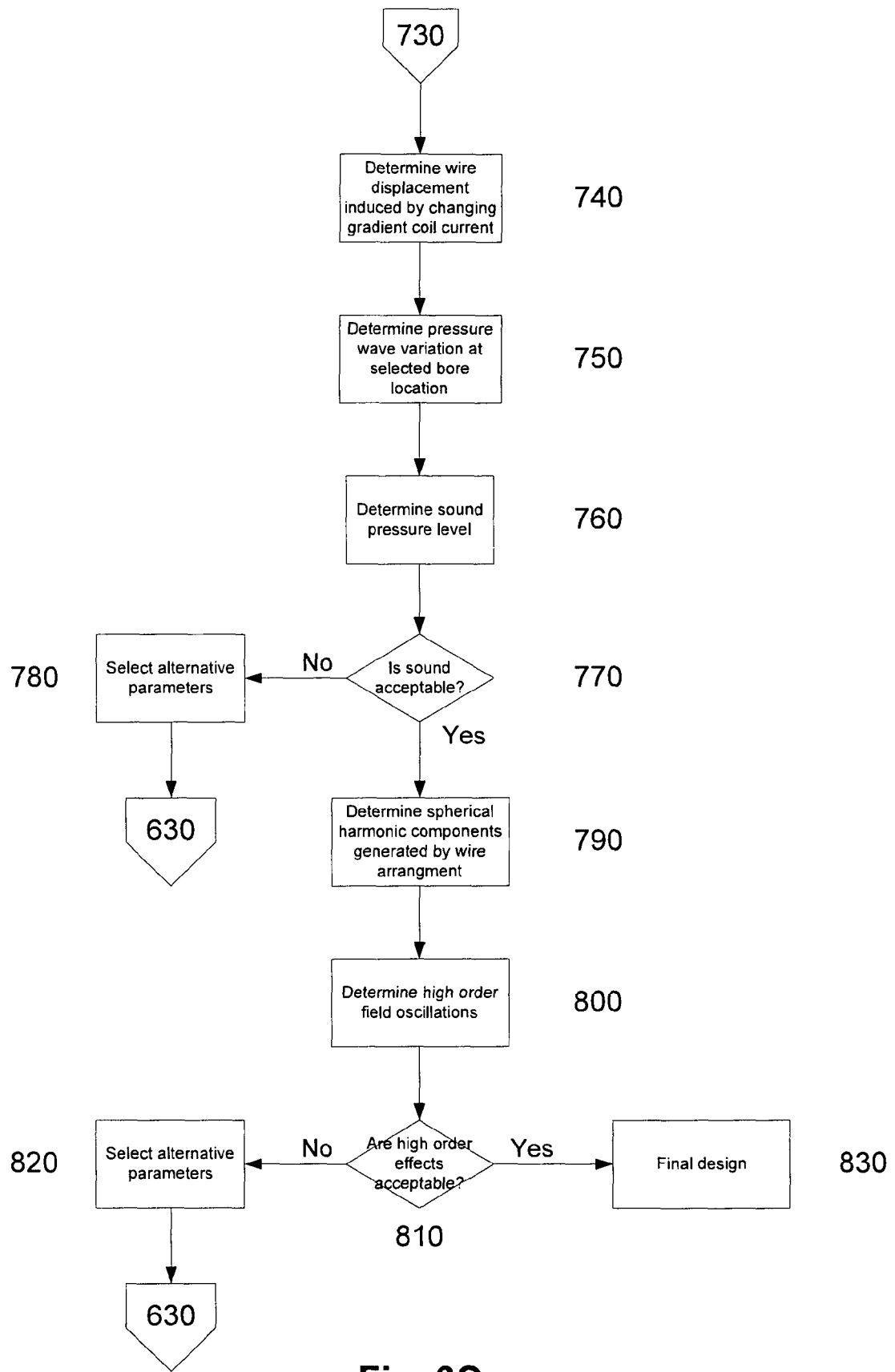

A detailed example outlining the design process for generating coil arrangements similar to those shown in FIGS. 2A to 2C will now be described with reference to FIGS. 6A to 6C. As part of this, comparisons of windings patterns are provided for a particular classical cylindrical gradient coil and the modified coil assembly.

For the purpose of this example, steps are described for obtaining a gradient coil design for which gradient magnetic field, acoustic noise and PNS are established. These steps are achieved through three independent procedures, which are coil layout design, acoustic noise simulation and spherical harmonic coefficient calculation, as described above. Coil layout design generates a coil winding pattern for the transverse gradient coil that produces an appropriate magnetic field within the DSV, while possibly minimising the inductance and resistance, and hence energy used by the coil configuration. The simulation of the acoustic noise is used to obtain a value for the noise generated by the gradient coil under operation. Finally, the magnetic field spherical harmonic coefficients are calculated to be able to comment on the high order field fluctuations leading to undesirable effects.

In order to design a coil layout such as that shown in FIGS. 2A to 2C, a flexible method for gradient coil design is required to simulate general gradient coils on domains that are not necessarily cylindrical. Consequently, the method of obtaining coil winding patterns is different to existing target field methods.

In this example, at step 600 the magnetic field is defined through pure harmonic coefficients to represent the appropriate gradient field. The full spherical harmonic representation in spherical coordinates is used to define the required z-component variation in the magnetic field:

$$B_r(r, \theta, \phi) = -\sum_{n=0}^{\infty}\sum_{m=0}^{n} n r^{n-1} P_n^m(\cos\theta)(a_{nm}\cos(m\phi) + b_{nm}\sin(m\phi)), \quad (1)$$

$$B_\theta(r, \theta, \phi) = \sin\theta \sum_{n=0}^{\infty}\sum_{m=0}^{n} r^{n-1} P_n^{m'}(\cos\theta)(a_{nm}\cos(m\phi) + b_{nm}\sin(m\phi)),$$

$$B_\phi(r, \theta, \phi) = \frac{1}{\sin\theta}\sum_{n=0}^{\infty}\sum_{m=0}^{n} m r^{n-1} P_n^m(\cos\theta)(a_{nm}\sin(m\phi) - b_{nm}\cos(m\phi)).$$

In (1) $P_n^m$ is the Legendre polynomial of degree n order m, and $a_{nm}$ and $b_{nm}$ are the associated harmonic coefficients in the spherical coordinate system for which a point in space is represented by $(r, \theta, \phi)$.

Equation (1) has been derived for divergence free current, which in this case means that (1) is divergence free and satisfies $\nabla \cdot (\nabla \times B) = 0$. As a result, a stream function S from which potential wire paths are obtained can be derived using:

$$\nabla \cdot S = 0 \rightarrow S = \nabla \times B. \quad (2)$$

Assuming that x, y and z-gradient coil fields have respective gradient strengths of $(G_x, G_y, G_z)$, then from (1) a pure x-gradient magnetic field can be defined by setting $a_{21} = G_x/3$ and all other spherical harmonic coefficients to zero. Similarly, a pure y-gradient magnetic field is obtained when $b_{21} = G_y/3$ and a pure z-gradient magnetic field when $a_{10} = -G_z/2$, while all other coefficients are zero.

This allows a spherical harmonic representation to be determined at step 610, which for different gradient coils with respective strengths of (3,3,−2) are as shown in Table 1.

TABLE 1

| Component | x-gradient | y-gradient | z-gradient |
|---|---|---|---|
| $B_r$ | $6r \sin\theta \cos\theta \cos\phi$ | $6r \sin\theta \cos\theta \sin\phi$ | $-\cos\theta$ |
| $B_\theta$ | $3r(\sin^2\theta - 2)\cos\phi$ | $3r(\sin^2\theta - 2)\sin\phi$ | $\sin\theta$ |
| $B_\phi$ | $-3r\cos\theta\sin\phi$ | $3r\cos\theta\cos\phi$ | 0 |

Using the information provided in Table 1, the magnetic field in any coordinate system can be obtained through an appropriately defined coordinate transformation. For example, at step 620 the cylindrical components of the magnetic field can be reconstructed at any point $(\rho,\theta,z)$ in the following manner:

$$B_\rho(\rho,\theta,z) = B_r(r,\theta,\phi)\sin\phi + B_\phi(r,\theta,\phi)\cos\phi,$$

$$B_\theta(\rho,\theta,z) = B_\theta(r,\theta,\phi),$$

$$B_z(\rho,\theta,z) = B_r(r,\theta,\phi)\cos\phi - B_\phi(r,\theta,\phi)\sin\phi. \quad (3)$$

By applying (3) it is possible to obtain expressions for the magnetic field components and corresponding field points in cylindrical coordinates through relationships $\rho = r\sin\theta$ and $z = r\cos\phi$, as shown in Table 2.

TABLE 2

| Component | x-gradient | y-gradient | z-gradient |
|---|---|---|---|
| $B_\rho$ | $\dfrac{3\rho z \cos\theta (2\sin\theta - 1)}{\sqrt{\rho^2 + z^2}}$ | $\dfrac{3\cos\theta (2\rho^2 \sin\theta + z^2)}{\sqrt{\rho^2 + z^2}}$ | $-\dfrac{\rho\cos\theta}{\sqrt{\rho^2 + z^2}}$ |
| $B_\theta$ | $3z(\sin^2\theta - 2)$ | $3\rho(\sin^2\theta - 2)$ | $\sin\theta$ |
| $B_z$ | $\dfrac{3\cos\theta (2z^2\sin\theta + \rho^2)}{\sqrt{\rho^2 + z^2}}$ | $\dfrac{3\rho z \cos\theta (2\sin\theta - 1)}{\sqrt{\rho^2 + z^2}}$ | $-\dfrac{z\cos\theta}{\sqrt{\rho^2 + z^2}}$ |

At step 630, taking the example of cylindrical surfaces, a stream function relationship is used to define current densities from (2) as follows:

$$S_\rho = \frac{1}{\rho}\frac{\partial B_\theta}{\partial z} - \frac{\partial B_z}{\partial \theta}, \quad (4)$$

$$S_\theta = \frac{\partial B_\rho}{\partial z} - \frac{\partial B_z}{\partial \rho},$$

$$S_z = \frac{1}{\rho}\left(\frac{\partial}{\partial \rho}(\rho B_\theta) - \frac{\partial B_\rho}{\partial \theta}\right).$$

At step 640 a number of wire paths, corresponding to the resulting number of coils, is selected, before contouring of the stream function is used to determine discrete wire paths at step 650.

In this example, in equation (4) the component of S normal to the cylinder surface is $S_\rho$, and this is therefore the component of interest from which current paths are defined through the contouring process. Example values of $S_\rho$ are provided in Table 3, which shows radial stream function components as defined using spherical harmonic expansion expressed in cylindrical coordinates, for the various gradient coils.

This process can be performed in one of two ways, either the values of Table 1 can be converted to cylindrical coordinates using (3), or the curl ($\tilde{N}'\{g\}$) of the magnetic field in spherical coordinates can be transformed to cylindrical coordinates. Either approach yields the same solution. Due to gradient coils having a finite length, apodisation of $S_\rho$ is to be used to ensure that wire return paths remain on the cylinder surface. This allows for closed contours to be formed upon which independent current carrying wires are discretely laid.

The reconstruction of the individual current paths is performed by contouring the stream function $S_\rho$ given in Table 3, through the selection of a number of different contour levels corresponding to the number of wire paths to be used in the design.

TABLE 3

| Component | x-gradient | y-gradient | z-gradient |
|---|---|---|---|
| $\dfrac{\partial B_z}{\partial \theta}$ | $\dfrac{3\cos\theta (2z^2\sin\theta + \rho^2)}{\sqrt{\rho^2 + z^2}}$ | $\dfrac{3\rho z(2\cos(2\theta) + \sin\theta)}{\sqrt{\rho^2 + z^2}}$ | $\dfrac{z\sin\theta}{\sqrt{\rho^2 + z^2}}$ |

TABLE 3-continued

| Component | x-gradient | y-gradient | z-gradient |
|---|---|---|---|
| $\dfrac{\partial B_\theta}{\partial z}$ | $3(\sin^2\theta - 2)$ | 0 | 0 |
| $S_\rho$ | $\dfrac{3(2z^2\cos(2\theta) - \rho^2\sin\theta)}{\rho\sqrt{\rho^2+z^2}}$ $-\dfrac{3(\sin^2\theta - 2)}{\rho}$ | $\dfrac{3z(2\cos(2\theta) + \sin\theta)}{\sqrt{\rho^2+z^2}}$ | $\dfrac{z\sin\theta}{\rho\sqrt{\rho^2+z^2}}$ |

At step 660, a shield layer configuration is obtained using the same expressions as specified in Table 3, but using the opposite sign on a layer that is distanced from the primary layer by a given amount, such as 10 cm, depending on the desired physical geometry of the coil assembly.

Once both the primary and shield layers have been defined and a preliminary contouring has been achieved by slicing $S_\rho$ at a designated number of levels as determined by the required gradient field strength, discrete contours paths are extracted from which both the magnetic field and gradient magnetic field are computed at step 670.

A suitable contour level spacing is then determined by comparing the computed gradient magnetic field and the expected gradient magnetic field at step 680, and using this to determine an error function at step 690. It is determined if the error function is acceptable at step 700.

In one example, this is achieved through iterated evaluations of an error function which is computed as the sum of squares of the deviations of the computed gradient magnetic field from the expected gradient magnetic field, for a number of different potential arrangements. Details of the error function, and the treatment of inductance and resistance are described in Vegh, V., et al., *Towards Designing Asymmetric Head Gradient Coils for High Resolution Imaging*. Concepts in Magnetic Resonance (Magnetic Resonance Engineering), 2007. February and, Vegh, V., et al., *A wave equation technique for designing compact gradient coils*. Concepts in Magnetic Resonance (Magnetic Resonance Engineering), 2006. 29B(2): p. 62-74.

Accordingly, this may be achieved using a Self-Adaptive Differential Evolution (SaDE) algorithm, as described for example in Brest, J., et al., *Performance comparison of self-adaptive and adaptive differential evolution algorithms*. Soft Computing—A Fusion of Foundations, Methodologies and Applications, 2007. 11(7): p. 617-629.

If it is determined that the coil layout is not acceptable, alternative parameters are selected at step 710. In one example, this can involve selecting a different number of wire paths, in which case the process can return to step 650, allowing the contouring process to be repeated. Alternatively, other parameters may be selected, such as the size of the coil assembly, or the like, with the process returning to step 630 to allow required current densities to be recalculated.

Once the above optimisation process converges to the desired gradient magnetic field, inductance, resistance and wire path, then the acoustic noise is computed.

In this example, at step 720 the Lorentz force acting on the wire path is calculated. The wire path itself is the discrete version of the set of stream function contours $\{s_i\epsilon(0,1):i=1 \ldots N\}$, where N is the number of primary layer contours. Similarly for the shield winding a set of contours are defined, where the number of layers is M and typically M<N.

Assuming that individual contours are defined as $S_{\rho,min}+s_i(S_{\rho,max}-S_{\rho,min})$, then the current density for that particular contour is given as:

$$J_i = J_0 \hat{s}_i, \quad (5)$$

where, $J_0$ is the user defined input current density and $\hat{s}_i$ defines the current direction from the contour path on the cylinder surface.

Generally the user defined input current $I_0$ is used instead of $J_0$, where $I_0=AJ_0$ and A is the wire cross-sectional area. In this case, the Lorentz force acting on the wire can be computed in the following manner:

$$F_i = J_i \times B_m. \quad (6)$$

In (6), $B_m$ is the magnetic field produced by the magnet in which the gradient coils are immersed. Assuming that the magnetic field acts mostly in the z-coordinate direction with magnitude $B_{z,m}$, and that the wire pattern is confined to the cylinder having components in the $\hat{\theta}$ and $\hat{z}$ directions alone, then the force is defined as:

$$F_{\rho,i} = J_{\theta,i} B_{z,m}, \quad (7)$$

where, $J_\theta$ is the angular cylindrical component of J and $F_r$ is the radial cylindrical component of F.

Given that the force has been computed from (7), the displacement u can be computed using the general displacement equation:

$$\varphi^T \underline{m} \varphi u + F = D \frac{\partial^2 u}{\partial t^2}, \quad (8)$$

In (8), D is the density of the material, $\underline{m}$ is the tensor of mechanical moduli and $\varphi$ is the appropriate first order differential operator.

Assuming that the time scale of pressure waves propagated by the displacement of the structure on which the wires are wound is significantly different, that is the pressure waves propagate at a much slower rate than the displacement occurs in time, and given an isotropic material, then (8) is simplified to the steady state radial displacement representation at step 730:

$$\frac{E_m}{2(1+v)} \nabla^2 u_\rho + F_\rho = 0, \quad (9)$$

where, $E_m$ is the modulus of elasticity of the material and v is the related Poisson's ratio.

Equation (9) is discretized to form a matrix problem using a second order finite difference stencil and solved using Incomplete LU factorization with zero fill (ILU0). The initial solution obtained using ILU0 is iterated using iterative refinement of the residual and convergence is achieved when the Euclidian norm (2-norm) of the residual is found to be adequately small. It was also found that this methodology performs well in this case in terms of speed, since the matrix problem is well-posed and is strictly diagonally dominant.

Having obtained the steady state displacements, the displacement at time t is calculated by assuming that the force is time dependent and varies instantaneously as the current is changed. A time dependent value for the current is therefore required, since the force is a function of the current as is depicted in (6) and (7), and it follows that the displacement is also a function of the current as can be seen in (9) through the radial force component.

To establish a time dependent current, the gradient coil is rewritten as a series LR equivalent circuit, which can be represented using the following equation:

$$V(t) = L\frac{dI(t)}{dt} + RI(t). \tag{10}$$

The solution to (10) given a pulse sequence defined through V(t), as in for example a gradient echo (GE) or spin echo (SE), can be obtained for I(t) by using the calculated coil inductance L and resistance R. Once I(t) is known, then the current induced displacement $u_r(t)$ is computed at step 740 by multiplying the steady state displacement obtained in (9) by $I(t)/I_0$. This step eliminates the need to have two different time stepping algorithms for the displacement boundary condition and the propagated pressure waves.

Assuming that the wave propagates at ambient pressure with velocity $c_0$ in a medium of density $D_0$, then at step 750 the pressure P can be computed from the wave velocity as:

$$P = D_0 \frac{\partial v}{\partial t}, \tag{11}$$

where, the velocity v of the pressure wave is governed by the wave equation:

$$\frac{\partial^2 v}{\partial t^2} = c_0^2 \nabla^2 v. \tag{12}$$

The equation of (12) for the velocity is solved using a second order in time and space finite difference time stepping algorithm expanded in cylindrical coordinates. The moving boundary that defines the interaction of the forced boundary with the air in the cylindrical duct through the solution of (12) is written as:

$$\frac{\partial v}{\partial r} = -\frac{\partial u_r}{\partial t}. \tag{13}$$

The pressure is simultaneously computed using (11) from the velocity profile at all points in space inside the chamber, whereby the cylindrical duct ends have a perfectly matched layer boundary condition applied to them to mimic the outward far field propagation of the pressure waves.

At a predetermined location in space within the acoustic chamber the pressure wave propagation in time is recorded, then converted to the frequency domain using Fourier transform F{g} for the computation of the Sound Pressure Level (SPL) at step 760. The time data converted to the frequency domain is then used to obtain SPL information via the standard point-by-point conversion:

$$SPL = 20\log_{10}\left(\frac{|F\{P(t)\}|}{20 \times 10^{-6}}\right) dB. \tag{14}$$

At step 770, it is determined if the acoustic noise is acceptable. In one example, this is achieved by comparing the sound pressure levels to a threshold indicative of the preferred maximum noise levels. If it is determined that the coil layout will result in unacceptable noise levels, then at step 780 alternative parameters, such as a different coil assembly geometry, different wire resistances, inductances, wire path numbers, or the like, can be selected. The process then returns to an earlier step, such as step 630 to allow required current densities to be recalculated and new coil layouts to be established.

Once the coil layout is determined to result in acceptable noise levels, then at step 790 spherical harmonic coefficients of the magnetic field generated by the optimised discrete wire paths are computed to evaluate the quality or purity of the field in terms of high order magnetic field oscillations at step 800, which is in turn indicative of the possibly of PNS. This is the reverse problem of (1), because the magnetic field components at different spatial locations are given and the harmonic coefficients are computed. The problem can be solved using a linear system of equations in which the unknowns are the individual spherical harmonic coefficients:

$$\zeta h = \beta, \tag{15}$$

where, h is a vector with dimension 2k of spherical harmonic coefficients consisting of $a_{nm}$ and $b_{nm}$ for which the degree n is predefined according to the number of spherical harmonic coefficients to be evaluated.

In (15), $\zeta$ is the over determinate matrix of dimension (3l,2k) representing coordinate information of l magnetic field locations and k=0.5n(n+1) is obtained as a consequence of the degree of the estimation. The right hand side vector β of dimension 3l consists of three magnetic field components distributed over l locations in predefined spherical volume around the DSV.

The solution to (15) is obtained in a least squares manner by solving:

$$\zeta^T \zeta h = \zeta^T \beta \rightarrow \zeta^* h = \beta^*. \tag{16}$$

In (16), the dimension of $\zeta^*$ is (2k,2k) and the dimension of $\beta^*$ is 2k. The condition number of $\zeta^*$ is generally large for a sufficiently large n, which means that the system is ill-conditioned and solution to the matrix problem can be tedious. Preconditioning of the system can be used to find solutions to (16) faster, but the use of Singular Value Decomposition (SVD) allows accurate results to be obtained in reasonable time for the harmonic coefficients h, provided that n≤10.

At step 810, it is determined if the high order effects are acceptable. In one example, this is achieved by comparing the sound pressure levels to a threshold indicative of the preferred quality or purity of the high order effects. If it is determined that the coil layout will result in unacceptable effects, then at step 820 alternative parameters, such as a different coil assembly geometry, different wire resistances, inductances, wire path numbers, or the like, can be selected. The process then returns to an earlier step, such as step 630 to allow required current densities to be recalculated and new coil layouts to be established.

Accordingly, the above described process allows a range of different gradient coil arrangements to be established which are non-cylindrical, and in particular, include a first portion having a substantially cylindrical shape for positioning in the bore and a second portion extending outwardly from an end of the first portion, the second portion being for positioning outside the bore.

Specific example coil arrangements will now be described in more detail.

For the purpose of this example, the classical straight cylinder fingerprint design (FIGS. 1A to 1C) is formulated along with the modified gradient coil arrangement (FIGS. 2A to 2C), referred to hereinafter as a wrapped edge design. For the purpose of this example, modelling was performed on the basis of Siemens 1.5 T system. Results are depicted for both cases and appropriate discussion is drawn given the underlying findings.

It should be noted that primary DSV generating magnet arrangements shorter than approximately 1.25 m in length magnets and with magnetic field strengths of at least 1.5 T do not currently exist within the whole body clinical setting. Therefore, instead of comparing a 1.2 m gradient coil to a shorter wrapped edge coil, a comparison is be provided for coils of the same length and improvements will be measured in terms of gradient field linearity inside a predefined region. This will allow gains to be measured within the same reference. Improvements in design will hence be stated in terms of field improvements, as opposed to length reductions. Nevertheless, the improvements in field linearity can easily be converted to reductions in gradient coil length and this will be discussed later.

It is not possible to obtain winding patterns for the Siemens 1.5 T gradient coil, since this information is held in confidence by the manufacturer. However, based on magnetic field camera readings harmonics of the gradient magnetic field produced in the 1.5 T Siemens systems were identified. From the harmonics, a reverse approach was used to identify the possible transverse gradient coil layout. The windings were refined for manufacturing impurities and optimized to exactly match the measured gradient magnetic field distribution of the transverse gradient coil. Hereon, all of the classical cylindrical windings are according to the measured gradient field spherical harmonic coefficients.

For both design approaches, the inner diameter of the gradient coil is set as 0.8 m with a 0.1 m separation between the primary and shield layer. The length of the cylinders on which the wires are wound for both designs is restricted to be less than 1.2 m. In all of the computations a high current rectangular cross section Litz wire with resistivity $2 \times 10^{-10}$ $\Omega$m is used. The former on which the wires are wound is made of a material with elastic properties $E_m = 7 \times 10^9$ Pa and $\mu_p = 0.3$.

Coil parameters for the straight edge and wrapped edge cylindrical transverse gradient coil designs are shown in Table 4.

TABLE 4

| Parameter | Straight Edge | Wrapped Edge |
| --- | --- | --- |
| Resistance [R] (m$\Omega$) | 40 | 60 |
| Inductance [L] ($\mu$H) | 710 | 805 |
| Rise time [t] ($\mu$s) | 216 | 246 |
| Peak noise (dB) | 120 | 110 |
| Current [$I_0$] (A) | 600 | 600 |
| Voltage [$V_0$] (V) | 2000 | 2000 |
| Gradient Strength [a] ($\mu$T/A/m) | 65 | 61 |
| Quality factor $\left[\eta = \dfrac{a^2 d^5}{\mu_0 L}\right]$ | 0.0115 | 0.0377 |

Figure 7A:
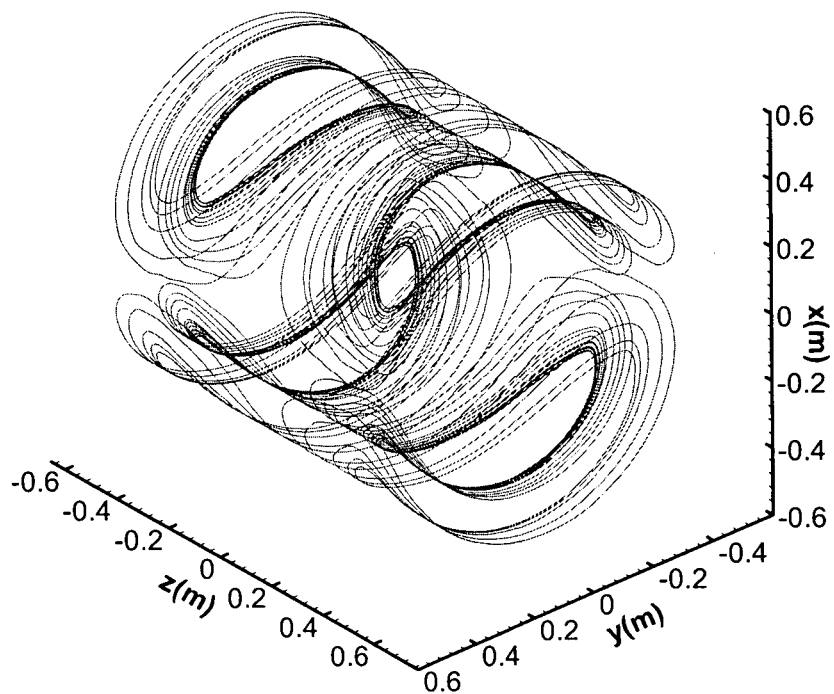
FIG. 7A is a graphical representation of a classical gradient coil arrangement.
Figure 7B:
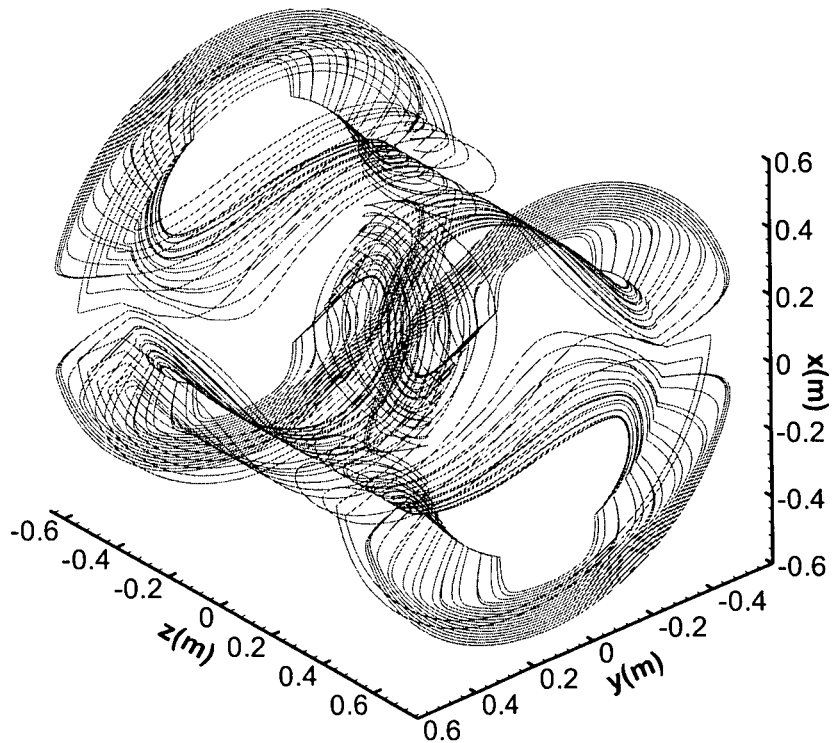
FIG. 7B is a graphical representation of an example of a modified gradient coil arrangement.

FIGS. 7A and 7B are example graphical representations of the resulting straight edge transverse gradient coil design and the wrapped edge coil design, respectively.

The individual wire paths are point wise defined in Cartesian space, where each wire path consists of a set of Cartesian points $\{C_{ij}\}$, where $C=(x_{ij},y_{ij},z_{ij})$ is the coordinate of wire contour i and point j. The same methodology was employed in the design of both straight edge and wrapped edge transverse gradient coils, with the exception that in the latter the wire paths beyond the $z_0 = 0.5$ m edge have been mapped to the transverse plane according to:

$$C_{ij} = (\lambda_{ij} x_{ij}, \lambda_{ij} y_{ij}, z_0), \lambda_{ij} = 1 + \frac{|z_{ij}| - |z_0|}{2\sqrt{x_{ij}^2 + y_{ij}^2}}. \tag{17}$$

Figure 8B:
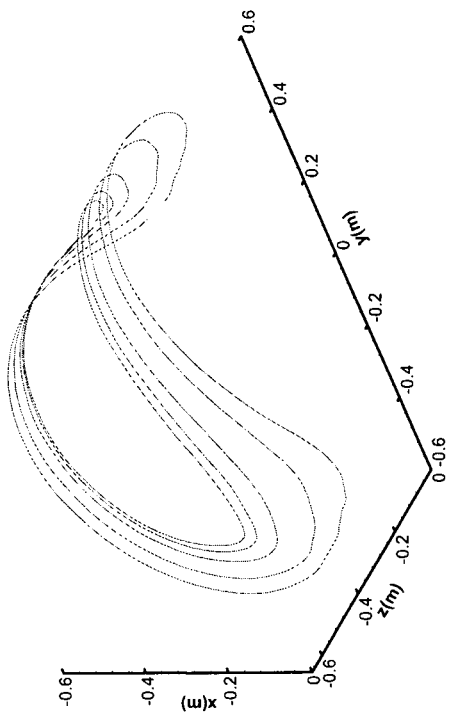
FIGS. 8A and 8B are graphical representations of classical gradient coil arrangements for primary and shield gradient coils respectively.
Figure 8D:
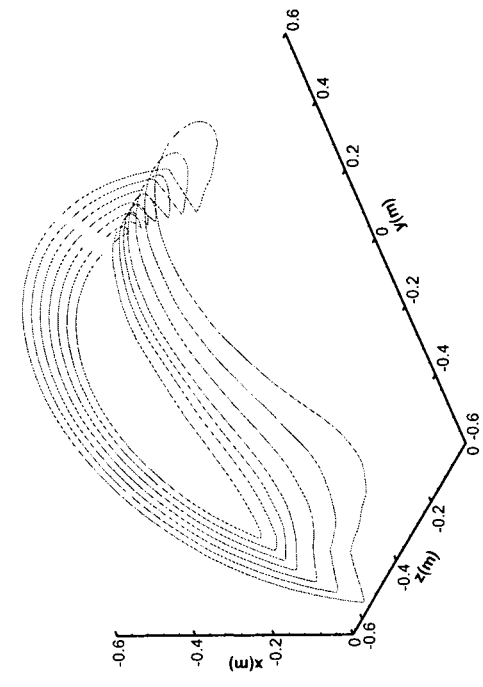
FIGS. 8C and 8D are graphical representations of modified gradient coil arrangements for primary and shield gradient coils respectively.
Figure 8A:
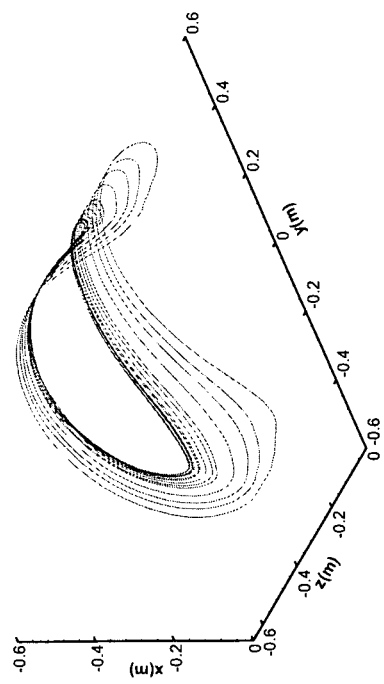
Figure 8C:
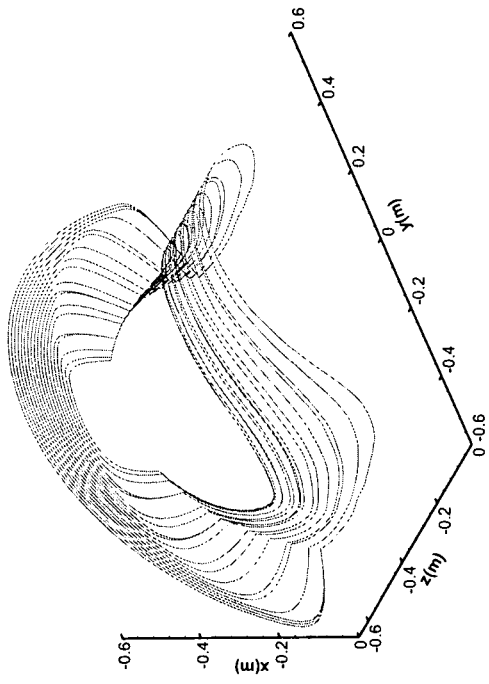

FIGS. 8A and 8B are graphical representations of a single quadrant of the transverse gradient coil designs for primary and shield layers in a straight edge coil arrangement, whilst FIGS. 8C and 8D show equivalent representations for the wrapped edge coil configurations.

Figure 9A:
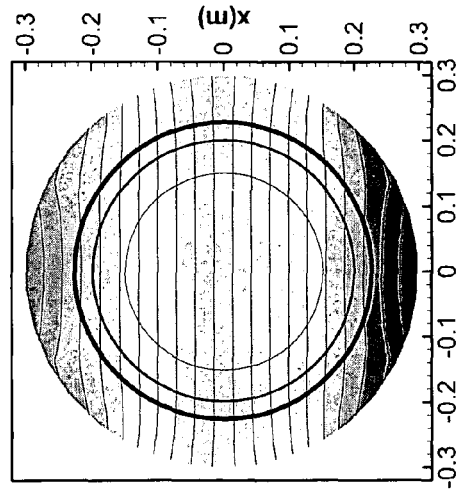
FIGS. 9A and 9B are graphical representations of the magnetic fields and magnetic field errors for classical gradient coils.
Figure 9B:
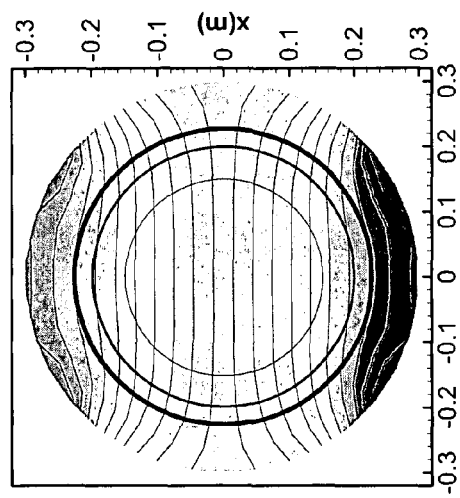

The corresponding magnetic field produced in the sagittal plane is illustrated in FIGS. 9A and 9B for the straight edge and wrapped edge coil designs respectively. This highlights that the wrapped edge winding pattern can produce a better gradient magnetic field for the transverse design, which is confirmed through the error plots with 5% contour lines plotted in FIGS. 10A and 10B.

Figure 10A:
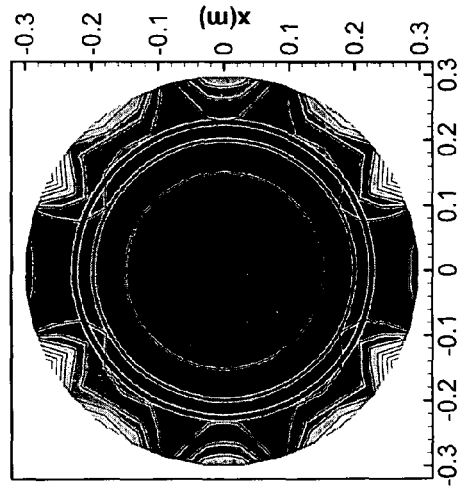
FIGS. 10A and 10B are graphical representations of the magnetic fields and magnetic field errors for modified gradient coils.
Figure 10B:
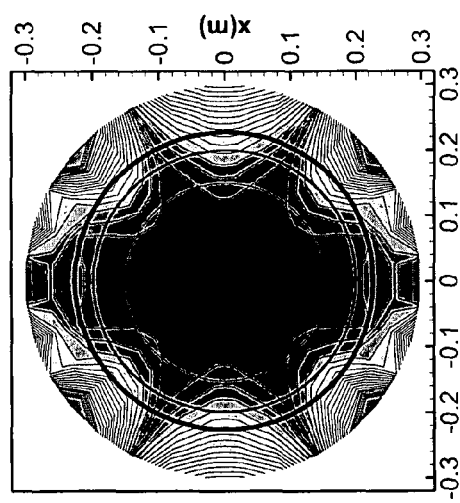

In FIGS. 9 and 10 circles corresponding to 30 cm, 40 cm and 45 cm DSV diameters are shown with progressively thicker outlines. By comparing FIGS. 10A and 10B, this highlights that the DSV for the wrapped edge design is significantly larger, whereby the 5% contour line in the case of FIG. 10A extends to approximately 28 cm, compared to 45 cm in the wrapped edge design of FIG. 10B. In terms of usable imaging volume relative to the 5% contour line, this means that in the wrapped edge design an increase of over 300% in volume is achieved for the 5% linearity DSV.

Figure 11B:
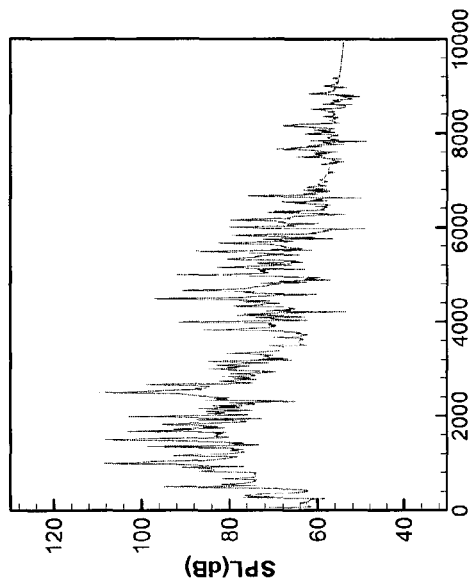
FIGS. 11A and 11B are magnetic field plots along a longitudinal axis for a classical and modified gradient coil.
Figure 11A:
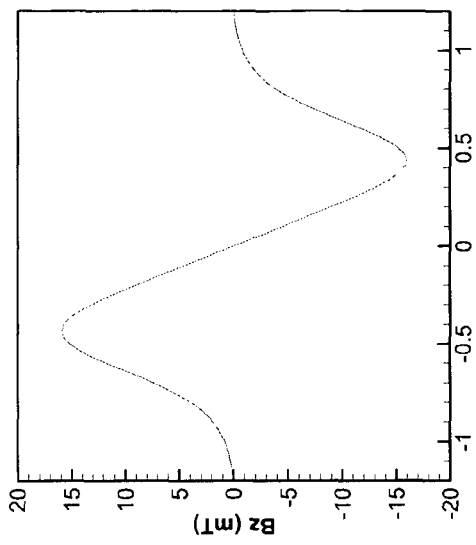

A 2D plot of the magnetic field is shown in FIGS. 11A and 11B for the gradient magnetic field linearity over the DSV. It can be seen that for the straight edge design, shown in FIG. 11A, the variation in magnetic field is greater over the same distance, verifying that PNS is more likely to be prominent in this case, as opposed to the wrapped edge design.

The various coil parameters for both designs are tabulated in Table 4. The resistance R and inductance L have been calculated as described above, and the rise time $\tau$ was derived using both inductance and resistance as:

$$\tau = \frac{LI_0}{V_0 - RI_0}. \tag{18}$$

The quality factor h was calculated according to the techniques described in Vegh, V., et al., *Towards Designing Asymmetric Head Gradient Coils for High Resolution Imaging.* Concepts in Magnetic Resonance (Magnetic Resonance Engineering), 2007. February, where the diameter d of the DSV to the 5% contour line is used to reflect a measure of delivered energy. The quality factor as a measure of DSV volume is greatly increased for the wrapped edge design, indicating that significantly more usable imaging volume is obtained in the wrapped edge design.

Equation (18) assumes a power supply with current $I_0$ and voltage $V_0$. In Table 4 the peak noise produced by the gradients was obtained at location (0.18 m, 0 m, 0.25 m) within the cylindrical chamber using a GE sequence, with 10 pulse repetitions. The gradient pulses were repeated in 100 ms to give a 1 s gradient pulse length. The calculations of Lorentz force were obtained for the case when the gradient is used in conjunction with a 1.5 T short bore clinical superconducting magnet with an inner diameter of 1 m.

Figure 12B:
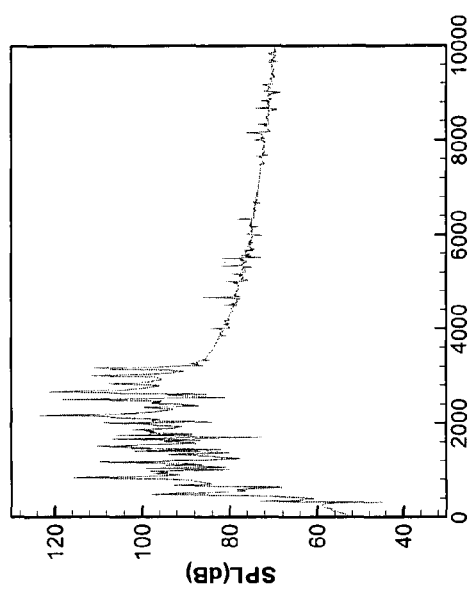
FIGS. 12A and 12B are examples of acoustic outputs obtained for classical and modified gradient coils; and, FIGS. 13A and 13B are schematic side view of examples of modified gradient coils.
Figure 12A:
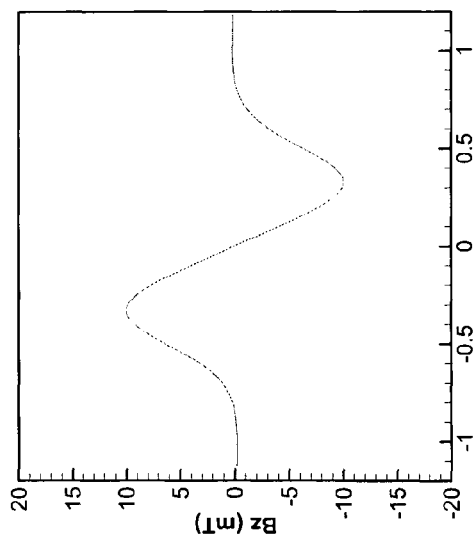

FIGS. 12A and 12B show the acoustic output obtained at the location of (0.18 m, 0 m, 0.25 m) for the straight edge and wrapped edge configurations respectively. This highlights that the simulated peak noise is less for the wrapped edge design, and the total amount of noise is also less as judged by the area under the SPL response.

Table 5 provides a list of calculated harmonic coefficients normalised by the appropriate gradient defining spherical harmonic for the straight edge and wrapped edge designs. In the table spherical harmonic coefficients that are less than −0.01 or greater than 0.01 are provided, with the assumption that other values are significantly small to have a major effect on the magnetic field behaviour.

In the table a number of spherical harmonic coefficients are highlighted to illustrate the differences between the field properties of the two coil winding methodologies. It can be seen that order 1 spherical harmonics corresponding to the even expansion terms ($a_{4,1}, a_{6,1}, a_{8,1}, a_{10,1}$) are larger for the straight edge design, than that computed for the wrapped edge design. As the degree of the harmonics increases the effect of the various coefficients decreases also, due to the term in (1). Nonetheless, $a_{6,1}$ and $a_{8,1}$ in the straight edge design is much larger than the equivalent value in the wrapped edge design, possibly indicating a greater amount of field oscillations leading to PNS, while the gradient coils are pulsed.

TABLE 5

| | | Straight | | Wrapped | |
|---|---|---|---|---|---|
| n | m | $a_{nm}$ | $b_{nm}$ | $a_{nm}$ | $b_{nm}$ |
| 2 | 1 | 1.00 | | 1.00 | |
| 3 | 0 | −0.026 | | −0.030 | |
| | 1 | 0.019 | | 0.022 | |
| 4 | 0 | −0.017 | | −0.019 | |
| | 1 | −0.91 | | −0.56 | |
| | 3 | 0.022 | | | |
| 5 | 0 | 0.047 | | 0.031 | |
| | 1 | 0.047 | | 0.059 | |
| 6 | 0 | −0.19 | | −0.24 | |
| | 1 | | | −2.75 | |
| 7 | 0 | 1.08 | | 1.14 | |
| | 1 | 0.068 | | 0.13 | |
| 8 | 0 | 0.010 | | −0.024 | |
| | 1 | | | | |
| | 2 | 0.019 | | 0.024 | |
| | 3 | −0.034 | | 0.26 | |
| 9 | 0 | 0.064 | | 0.054 | |
| | 1 | | −0.012 | 1.4 | −0.014 |
| | 2 | −0.061 | −0.011 | −0.078 | −0.018 |
| 10 | 1 | 0.71 | | 0.093 | |
| | 2 | 0.035 | | 0.073 | 0.016 |
| | 3 | 0.11 | | −0.084 | |

Whilst the above discussion has focused on improved gradient field linearity, as primary magnets become shorter, the gradient coils will also be required to be made shorter. Usually, scaling of gradient coils can be applied using a scaling factor derived by dividing the length of the gradient coil by the size of the DSV. Generally, the size used in these applications is 45 cm (factor then is 1.2/0.45=2.67, which is consistent with published findings of around 2.5), but here the 5% contour line size is used. Hence, for the straight cylinder classical design the scaling factor is 1.2/0.3=4 and for the wrapped edge design it is 1.2/0.45=2.67. This is to say that given a 30 cm DSV, the gradient coil length is 4×DSV for the classical straight edge design and 2.67×DSV for the wrapped edge layout. Therefore, for a 30 cm DSV in the case of the wrapped edge design, the gradient coil length would be approximately 2.67×0.3=0.8 m.

Accordingly, the above describes a novel wire winding approach for transverse gradient coils. Comparison of simulation results demonstrates that the new wrapped edge design can provide a significantly larger DSV (or a shorter transverse gradient coil), whilst utilising a shorter bore. In addition to this, the gradient coil arrangement can result in reduce noise levels, and a lower probability of PNS arising in tissue, than otherwise achievable in the straight edge design.

These findings were established on the basis of comparing the DSV errors computed from the gradient magnetic fields, from which harmonic coefficients were computed to establish high frequency field oscillations. To gauge acoustic noise levels generated by the different designs, time dependent acoustic pressure fields using a general gradient echo sequence were also calculated.

The gradient magnetic field purity of the wrapped edge design provides a volume that extends to 45 cm in diameter at the 5% error level, which is highly desirable when compared to the 30 cm otherwise obtained using the traditional straight edge winding pattern. This finding was translated to length reductions, and comparatively the 1.2 m straight edge design was reduced to the 0.8 m wrapped edge layout, when the field properties were held constant. PNS was judged to be less in the wrapped edge design, since the computed order 1 harmonics in general were smaller in the wrapped edge case, in comparison to the straight edge gradient coil. The wrapped edge gradient coil has smaller inductance and less high order field oscillations, and therefore it can be switched faster than other gradient coil designs. The peak acoustic noise produced by the straight edge transverse gradient coil (120 dB) was overall larger than that simulated for the wrapped edge case (110 dB).

Figure 13A:
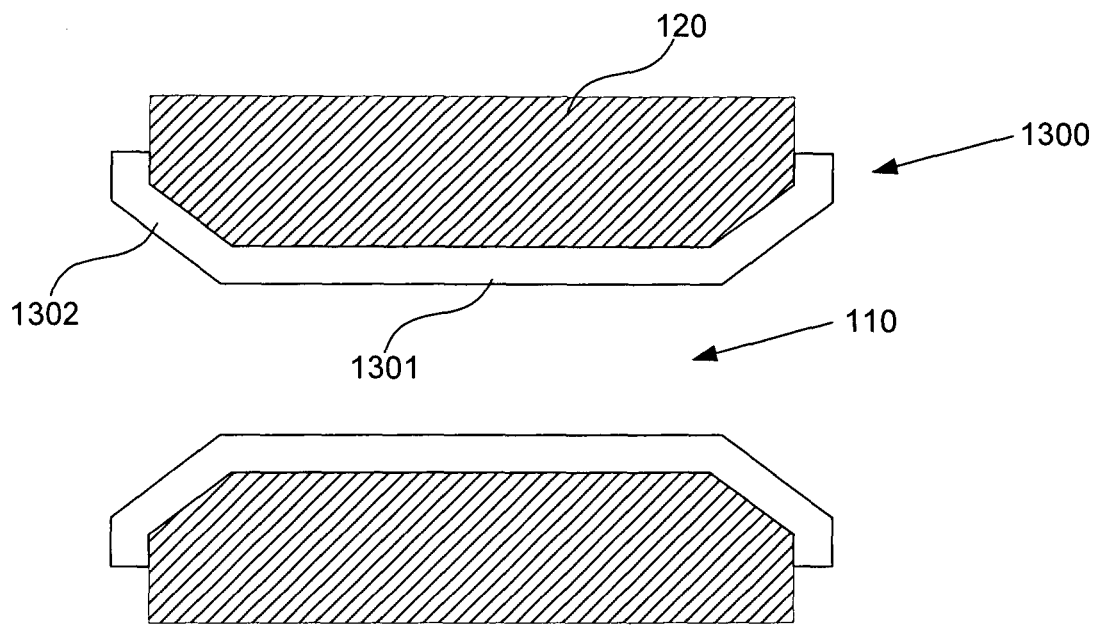
Figure 13B:
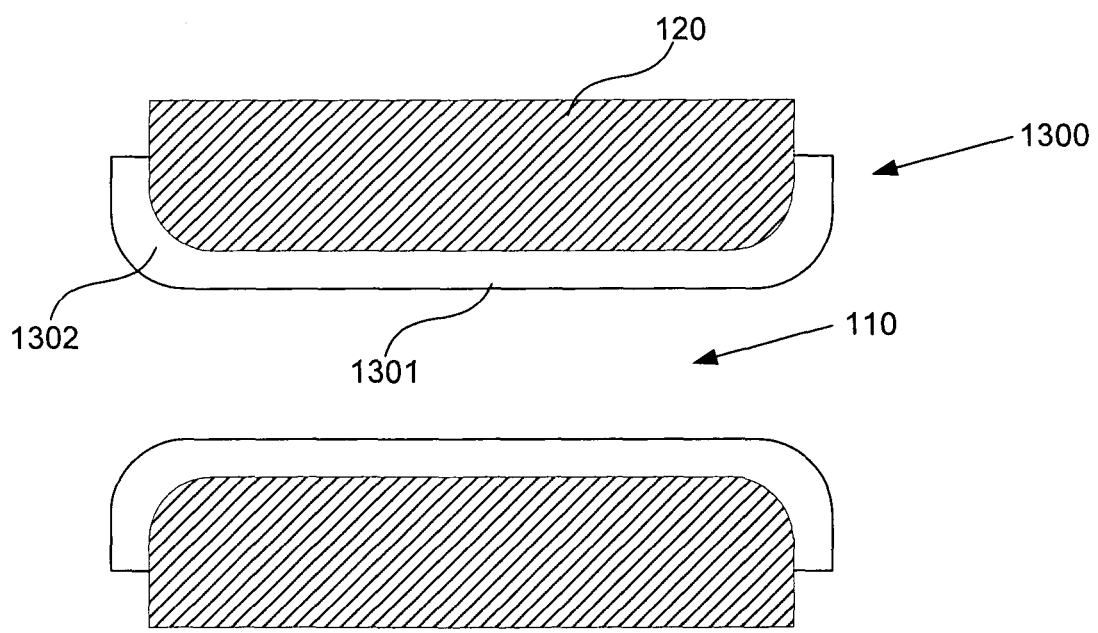

The above described examples focus on providing the ends of the gradient coil in a transverse plane for whole body clinical MRI systems. However, it will be appreciated that the general concept of using return current paths located outside of the bore for gradient coils could be implemented using a variety of arrangements. Thus, for example, as shown in FIGS. 13A and 13B, the gradient coils 1300 include the first portion 1301 inside the bore 110 of the primary magnets 120, with a second portion 1302 positioned outside the bore. In these examples the second portion is angled or curved, and it will be appreciated from this that any suitable arrangement can be used.

Typically irrespective of the shaping, the second portion extends at least partially radially outwardly from the first portion, thereby ensuring that the second portion does not obstruct access to the bore, and to ensure the return current paths are separated from the bore as much as possible, thereby ensuring that any field generated by the return current paths provides minimal contribution to the gradient field. The use of a range of different shapes can also have benefits in reducing acoustic noise effects.

Persons skilled in the art will appreciate that numerous variations and modifications will become apparent. All such variations and modifications which become apparent to persons skilled in the art, should be considered to fall within the spirit and scope that the invention broadly appearing before described.

The invention claimed is:

1. A gradient coil arrangement for use in a magnetic imaging system, the imaging system being for generating a magnetic imaging field in an imaging region provided in a bore, the coil arrangement including:
   a) a first portion having a substantially cylindrical shape for positioning in the bore;
   b) a second portion extending outwardly from an end of the first portion, the second portion being for positioning outside the bore; and, c) at least one coil for generating a gradient magnetic field in the imaging region, the at least one coil having a first part provided on the first portion and a second part provided on the second portion, wherein the first part is for generating the gradient field and wherein the second part is for providing a return current path.

2. A coil arrangement according to claim 1, wherein the second portion has a substantially annular shape.

3. A coil arrangement according to claim 1, wherein the second portion extends radially outwardly from the first portion.

4. A coil arrangement according to claim 1, wherein the coil arrangement includes:
   a) at least one primary coil for generating the gradient field; and,
   b) at least one shield coil for generating a shielding field.

5. A coil arrangement according to claim 4, wherein the at least one shield coil is provided radially outwardly of the at least one primary coil.

6. A coil arrangement according to claim 1, wherein the coil arrangement includes at least first and second primary coils for generating first and second gradient fields.

7. A coil arrangement according to claim 6, wherein the first and the second gradient fields are orthogonal.

8. A coil arrangement according to claim 1, wherein the coil arrangement is for generating a transverse gradient field.

9. A coil arrangement according to claim 8, wherein the transverse gradient field is transverse to a bore axis of the imaging apparatus.

10. A coil arrangement according to claim 1, wherein the coil arrangement includes a number of cooling pipes for receiving a coolant.

11. A coil arrangement according to claim 1, wherein the gradient coil arrangement includes first and second coil arrangement sections positioned in opposing first and second ends of the bore, each section having respective first and second portions and respective coils.

12. A method of determining a gradient coil arrangement for use in a magnetic imaging system, the imaging system being for generating a magnetic imaging field in an imaging region provided in a bore, the method including determining a coil arrangement including:
   a) a first portion having a substantially cylindrical shape for positioning in the bore;
   b) a second portion extending outwardly from an end of the first portion, the second portion being for positioning outside the bore; and,
   c) at least one coil for generating a gradient magnetic field in the imaging region, the at least one coil having a first part provided on the first portion and a second part provided on the second portion, wherein the first part is for generating the gradient field and wherein the second part is for providing a return current path.

13. A method according to claim 12, wherein the method includes:
   a) designing at least one gradient coil layout; and,
   b) determining if the gradient coil layout is acceptable by at least one of:
      i) simulating acoustic noise generated by the coil layout; and,
      ii) determining high order field oscillations.

14. A method according to claim 12, wherein the method includes:
   a) determine target field components;
   b) determine current densities required to generate the target field components; and,
   c) determine gradient coil wire paths using the current densities.

15. A method according to claim 14, wherein the method includes, using a stream function to determine current densities required on at least the first portion to generate the target field components.

16. A method according to claim 14, wherein the method includes:
   a) selecting a number of wire paths; and,
   b) determine gradient coil wire paths using the selected number.

17. A method according to claim 16, wherein the method includes, contouring the stream function using the selected number of wire paths to determine discrete wire paths.

18. A method according to claim 17, wherein the method includes:
   a) comparing the theoretical field to the target field;
   b) determining if the wire paths are acceptable based on the results of the comparison.

19. A method according to claim 12, wherein the method includes:
   a) determining a theoretical field generated by the wire paths; and,
   b) using the theoretical field to determine if the wire paths are acceptable.

20. A method according to claim 19, wherein the method includes
   a) determining an error function using the results of the comparison for each of a different number of wire paths; and,
   b) selecting a wire path configuration based on the determined error functions.

21. A method according to claim 12, wherein the method includes, simulating acoustic noise generated by the coil arrangement by:
   a) determining forces acting on wires in the gradient coils;
   b) determining wire displacements generated by applied currents; and,
   c) determining a pressure wave generated by the wire displacement; and,
   d) determining the sound pressure level using the generated pressure wave.

22. A method according to claim 21, wherein the method includes, determining wire displacements by:
   a) determining steady state wire displacements; and,
   b) determining wire displacement induced by applied current using the steady state wire displacements.

23. A method according to claim 12, wherein the method includes, determining high order field oscillations at least in part by determining spherical harmonic components generated by the wire arrangement.

* * * * *